(12) United States Patent
Kihara

(10) Patent No.: US 10,985,525 B2
(45) Date of Patent: Apr. 20, 2021

(54) TRANSMITTER MODULE

(71) Applicant: SUMITOMO ELECTRIC DEVICE INNOVATIONS, INC., Yokohama (JP)

(72) Inventor: Toshiaki Kihara, Yokohama (JP)

(73) Assignee: Sumitomo Electric Device Innovations, Inc., Yokohama (JP)

(*) Notice: Subject to any disclaimer, the term of this patent is extended or adjusted under 35 U.S.C. 154(b) by 218 days.

(21) Appl. No.: 16/386,420

(22) Filed: Apr. 17, 2019

(65) Prior Publication Data

US 2019/0319424 A1   Oct. 17, 2019

(30) Foreign Application Priority Data

Apr. 17, 2018 (JP) .................... 2018-079032

(51) Int. Cl.
| | |
|---|---|
| *H01S 5/02253* | (2021.01) |
| *H01S 5/02212* | (2021.01) |
| *G02B 3/00* | (2006.01) |
| *G02B 1/04* | (2006.01) |
| *H04B 10/50* | (2013.01) |
| *H01S 5/024* | (2006.01) |
| *H01S 5/0683* | (2006.01) |
| *H01S 5/02325* | (2021.01) |

(52) U.S. Cl.
CPC .......... *H01S 5/02253* (2021.01); *G02B 1/041* (2013.01); *G02B 3/00* (2013.01); *H01S 5/02212* (2013.01); *G02B 2003/0093* (2013.01); *H01S 5/02325* (2021.01); *H01S 5/02415* (2013.01); *H01S 5/0683* (2013.01); *H04B 10/50* (2013.01)

(58) Field of Classification Search
CPC .......... G02B 19/0014; G02B 19/0052; G02B 1/041; G02B 2003/0093; G02B 3/00; H01S 5/005; H01S 5/02212; H01S 5/02248; H01S 5/02252; H01S 5/02276; H01S 5/02288; H01S 5/02415; H01S 5/06226; H01S 5/0683; H04B 10/50
See application file for complete search history.

(56) References Cited

U.S. PATENT DOCUMENTS

2004/0245446 A1* 12/2004 Oomori ................. H01S 5/0683
250/238

FOREIGN PATENT DOCUMENTS

JP        2001-281501 A    10/2001

* cited by examiner

*Primary Examiner* — Joseph P Martinez
*Assistant Examiner* — Vipin Patel
(74) *Attorney, Agent, or Firm* — Baker Botts L.L.P.; Michael A. Sartori

(57) ABSTRACT

The transmitter module including a semiconductor laser chip, a first carrier, a second carrier, and a lens is disclosed. The first carrier mounts the semiconductor laser chip thereon. The second carrier includes a first surface, a second surface, and a connection surface connecting the first surface with the second surface. The first surface faces in a first direction intersecting an axis direction of the chip to mount the first carrier thereon. The second surface faces in the first direction and is provided at a position farther away from the axis of the chip than the first surface. The lens is fixed to the second surface by an adhesive resin. The connection surface is set back far from a front end of the first carrier adjacent to an emission end of the chip toward a back end of the first carrier opposite to the front end in the axis direction.

6 Claims, 12 Drawing Sheets

TRANSMITTER MODULE

CROSS REFERENCE

The present application is based upon and claims the benefit of the priority from Japanese Patent Application No. 2018-079032 filed on Apr. 17, 2018, the entire contents of which are incorporated herein by reference.

TECHNICAL FIELD

The present disclosure relates to a transmitter module.

BACKGROUND

JP2001-281501A discloses a laser diode (LD) module used for an optical communications system. This LD module includes an LD package. The LD package includes a base formed of a Fe type material, a carrier fixed to the base, and an LD mounted on the carrier.

SUMMARY

The present disclosure provides a transmitter module. This transmitter module comprises a semiconductor laser chip, a first carrier, a second carrier, and a lens. The first carrier mounts the semiconductor laser chip thereon. The second carrier includes a first surface, a second surface, and a connection surface connecting the first surface with the second surface. The first surface faces in a first direction intersecting an axis direction of the semiconductor laser chip so as to mount the first carrier thereon. The second surface faces in the first direction and is provided at a position farther away from the axis of the semiconductor laser chip than the first surface. The lens is fixed to the second surface by an adhesive resin such that an emission beam from the semiconductor laser chip is incident on the lens. The connection surface is set back far from a front end of the first carrier adjacent to an emission end of the semiconductor laser chip toward a back end of the first carrier opposite to the front end in the axis direction.

BRIEF DESCRIPTION OF THE DRAWINGS

The foregoing and other purposes, aspects and advantages will be better understood from the following detailed description of embodiments of this disclosure with reference to the drawings, in which.

DETAILED DESCRIPTION

Figure 1:
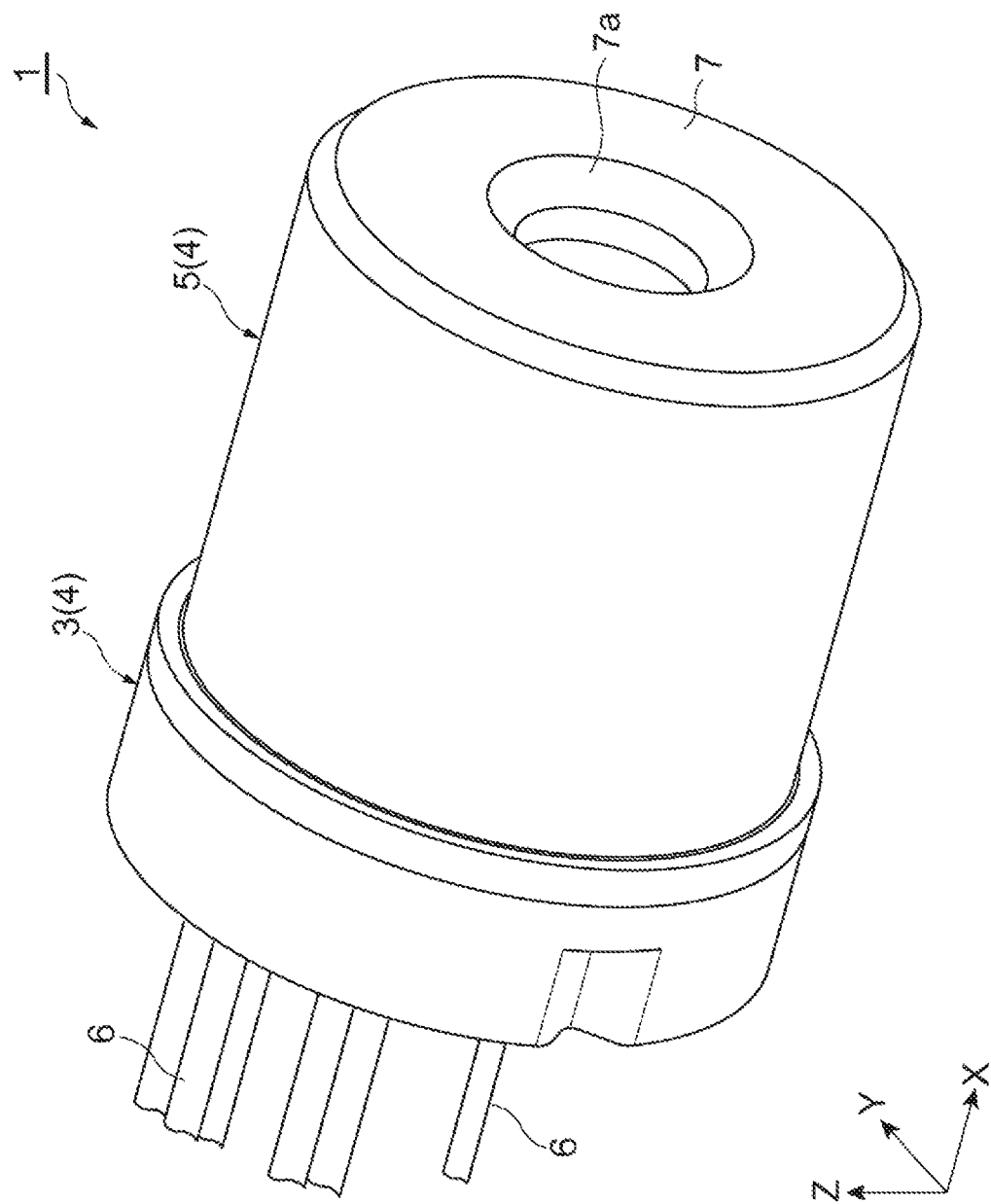
FIG. 1 is a perspective view of a transmitter module according to an embodiment.

Problem to be Solved by the Present Disclosure

When a semiconductor laser chip and a lens are arranged on a carrier in the transmitter module, a sub carrier on which the semiconductor laser chip is mounted can be mounted on the carrier and the lens can be fixed to the carrier by an adhesive. In this case, when the adhesive for fixing the lens in position extends to the end of the sub carrier, the adhesive is contracted as it is cured, with the result that the lens is sometimes deviated in position.

Advantageous Effect of the Present Disclosure

The present disclosure can prevent positional deviation of the lens.

Description of the Embodiments of the Present Disclosure

An embodiment of the present disclosure will be described in detail. A transmitter module according to an embodiment of the present disclosure comprises a semiconductor laser chip, a first carrier, a second carrier, and a lens. The first carrier mounts the semiconductor laser chip thereon. The second carrier includes a first surface, a second surface, and a connection surface connecting the first surface with the second surface. The first surface faces in a first direction intersecting an axis direction of the semiconductor laser chip so as to mount the first carrier thereon. The second surface faces in the first direction and is provided at a position farther away from the axis of the semiconductor laser chip than the first surface. The lens is fixed to the second surface by an adhesive resin such that an emission beam from the semiconductor laser chip is incident on the lens. The connection surface is set back far from a front end of the first carrier adjacent to an emission end of the semiconductor laser chip toward a back end of the first carrier opposite to the front end in the axis direction.

In this transmitter module, the connection surface is set back far from a front end of the first carrier adjacent to an emission end of the semiconductor laser chip toward a back end of the first carrier opposite to the front end in the axis direction. That is, the connection surface of the second carrier retreats from the front end of the first carrier. Thus, in the second surface to which the lens is fixed, it is possible to secure a long distance between the connection surface of the second carrier and the lens. As a result, this embodiment prevents the adhesive applied to the second surface from reaching the connection surface. Therefore, this embodiment can prevent position deviation of the lens due to contraction of the adhesive.

In one embodiment, the lens may include a lens main body, a flange surrounding a peripheral edge of the lens main body, and a fixed portion. The fixed portion may be provided at least at one portion of the peripheral edge of the flange and be fixed to the second surface of the second carrier. The fixed portion may protrude from the flange and in the axis direction. In this configuration, it is possible for the area of the fixed portion facing the second surface to be large, so that it is possible to fix the fixed portion firmly to the second surface.

In one embodiment, the fixed portion may have a slit extending in the axis direction of the lens. In this configuration, adhesive enters the slit, whereby it is possible to achieve an improvement in terms of the durability of the lens with respect to the external force exerted in the direction along the second surface crossing the axis direction.

In one embodiment, the fixed portion may protrude from the flange solely on one side of the axis direction. This configuration allows free designing of the lens on the other side of the axis direction. For example, when the fixed portion is caused to protrude solely on the incident surface side, it is possible to enlarge the diameter of the lens main body on the emission surface. In this case, it is possible to enlarge the diameter of the collimated beam without changing the size of the lens outer contour.

In one embodiment, the lens may be a resin lens. This configuration can facilitate the production of the lens.

In one embodiment, the lens may include a first region and a second region. The emission beam from the semiconductor chip is incident on the first region which has a curvature. The incident emission beam is output from the second region which has a curvature. A distance from the second surface to the first region may be larger than a distance from the second surface to the second region along the first direction. Even if the adhesive applied to the second surface reaches the connection surface, this configuration can prevent the adhesive from reaching the first region on which the emission beam is incident.

Detailed Description of the Embodiment of the Present Disclosure

Specific examples of the transmitter module according to embodiments of the present disclosure will be described with reference to the drawings. The present invention is not restricted to these examples, and it is intended that all changes within a scope indicated by the appended claims and equivalent to the appended claims in sense and scope are included. In the following description, the same components in the drawings are designated by the same reference numerals, and a redundant description will be left out.

Figure 2:
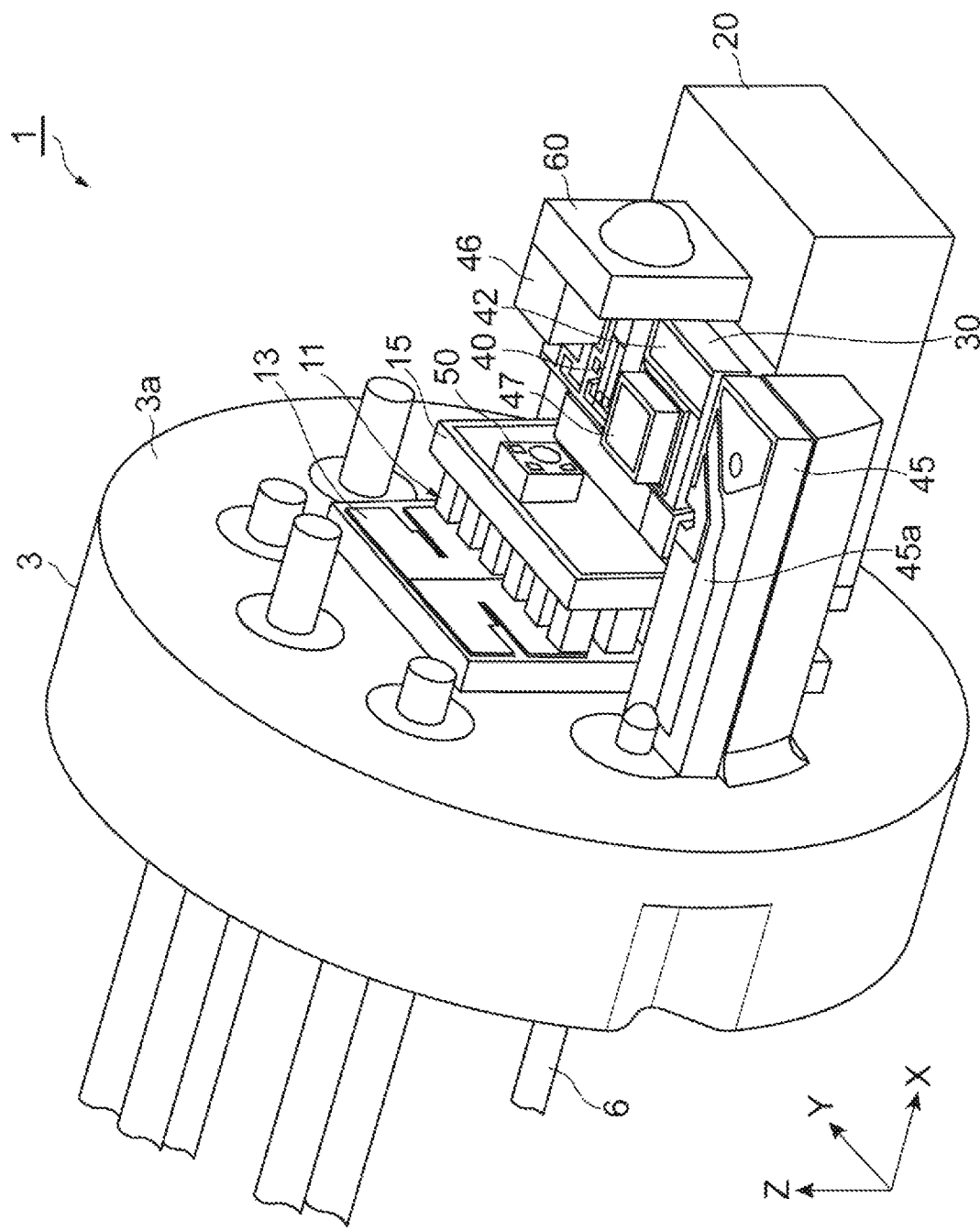
FIG. 2 is a perspective view of the transmitter module with a cap removed therefrom.
Figure 3:
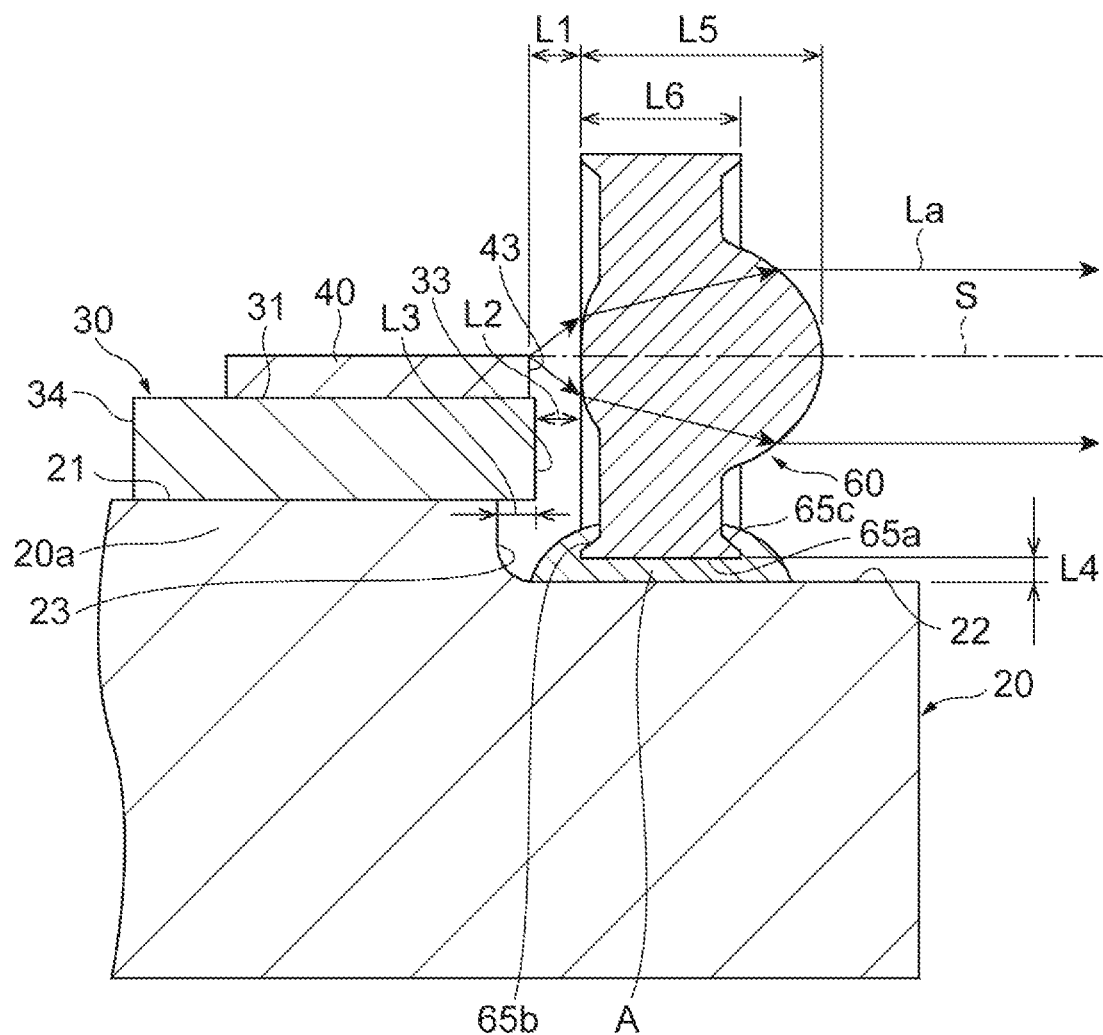
FIG. 3 is an enlarged partial sectional view of the transmitter module.

FIG. 1 is a perspective view of a transmitter module according to an embodiment. FIG. 2 is a perspective view of the transmitter module with a cap removed therefrom. FIG. 3 is an enlarged partial sectional view of the transmitter module. In the drawings, the XYZ orthogonal coordinate system is shown as appropriate. Sometimes in the following description, the X-axis direction will be referred to as the axis direction, the Z-axis direction will be referred to as the up-down direction, and the Y-axis direction will be referred to as the right-left direction. A transmitter module 1 comprises a CAN package 4. The CAN package 4 has a stem 3 and a cap 5. The stem 3 and the cap 5 are joined to each other by resistance welding, and the inner space of the CAN package 4 is maintained airtight. The stem 3 is formed in a substantially disc-like configuration, and has a main surface 3a facing the inner space of the CAN package 4. The CAN package 4 is provided with a plurality of lead pins 6. The lead pins 6 extend through the stem 3, and are utilized as terminals for electricity supply, grounding, and electric signal input/output. The cap 5 is substantially of a cylindrical configuration, and has a side wall 7 at one end in the axial direction. At the center of the side wall 7, there is formed a circular opening 7a. In the case where the transmitter module 1 is mounted in a small optical transceiver such as Small Form-factor Pluggable (SFP) and SFP+, the diameter of the CAN package (outer diameter size) may be, for example, 5.6 mm.

In the CAN package 4, a thermoelectric transducer 11, a sub carrier 30, a carrier 20, a semiconductor laser chip 40, a monitor photodiode monitor (PD) 50, and a lens 60 are accommodated.

The thermoelectric transducer 11 consists, for example, of a Peltier device. In accordance with the direction of an electricity supply current, one surface of the thermoelectric transducer 11 constitutes one of a heat absorption surface and a heat radiation surface, and the other surface thereof constitutes the other of the heat absorption surface and the heat radiation surface. The thermoelectric transducer 11 is provided between a pair of plate-like bodies 13 and 15. The thermoelectric transducer is provided on a main surface 3a of the stem 3 through the intermediation of the plate-like body 13. These plate-like bodies 13 and 15 are formed of an insulating material (e.g., MN or $Al_2O_3$). The thermoelectric transducer 11 is contained in the CAN package 4, whereby the semiconductor laser chip 40 is maintained at a fixed temperature. For example, the temperature of the semiconductor laser chip 40 is adjusted within a wide range of −40° C. to 80° C.

The sub carrier 30 is of a rectangular plate-like configuration, and is formed, for example, of an insulating material (e.g., ceramics such as AlN). On an upper surface (main surface) 31 of the sub carrier 30, the semiconductor laser chip 40 emitting a beam in the direction of an axis S (the axis direction) is mounted. The semiconductor laser chip 40 is of a monolithic structure in which a laser diode and an optical modulator are packaged on a common substrate. High frequency wiring 42 is formed on the sub carrier 30 through metallization. The high frequency wiring 42 is electrically connected to high frequency wiring 45a formed through metallization on a ceramic substrate 45 arranged on a main surface 3a of the stem 3. For example, the high frequency wiring 42 and the high frequency wiring 45a can be connected to each other by an Au wire of a diameter of 25 μm. Further, in the example shown, a thermistor 46 and a capacitor 47 are mounted on the upper surface of the sub carrier 30.

The carrier 20 is arranged on the plate-like body 15. The carrier 20 is formed of the same insulating material as that of the sub carrier 30. The carrier 20 has a protrusion 20a on the upper surface thereof. That is, the carrier 20 includes a first upper surface 21, a second upper surface 22, and a connection surface 23 connecting the first upper surface 21 with the second upper surface 22. The first upper surface 21 and the second upper surface 22 faces in a first direction (the Z-axis direction) crossing the axis direction. The second upper surface 22 is formed at a position farther away from the axis S than the first upper surface 21. That is, the distance to the second upper surface 22 from the axis S is larger than the distance to the first surface 21 from the axis S. Further, the second upper surface 22 is formed at a position lower than the first upper surface 21. In the example shown, the first upper surface 21 and the second upper surface 22 are both flat surfaces, and the connection surface 23 extends perpendicularly with respect to the first upper surface 21 and the second upper surface 22. The boundary between the connection surface 23 and the second upper surface 22 may be smoothly curved. The sub carrier 30 is mounted on the first upper surface 21 of the carrier 20.

The monitor PD 50 monitors the emission beam from the semiconductor laser chip 40. In the example shown, the monitor PD 50 is arranged on the plate-like body 15, and at a position on the rear side of the semiconductor laser chip 40. The monitor PD 50 receives a back beam emitted to the rear of the semiconductor laser chip 40.

The lens 60 is fixed to the second upper surface 22 of the carrier 20 by adhesive A. An emission beam La from the semiconductor laser chip 40 is incident on the lens 60. In an example, the lens 60 is a surface mounting type resin lens. The adhesive A in the present embodiment is an adhesive resin consisting of an ultraviolet curing resin. The lens 60 is, for example, a collimating lens converting the emission beam La from the semiconductor laser chip 40 to a collimated beam. For example, in a combination device such as 10 Gigabit Ethernet Passive Optical Network (10G-EPON), the emission beam from the transmitter module 1 is converted to a collimated beam, whereby the optical design, filter design, etc. are facilitated.

Figure 4:
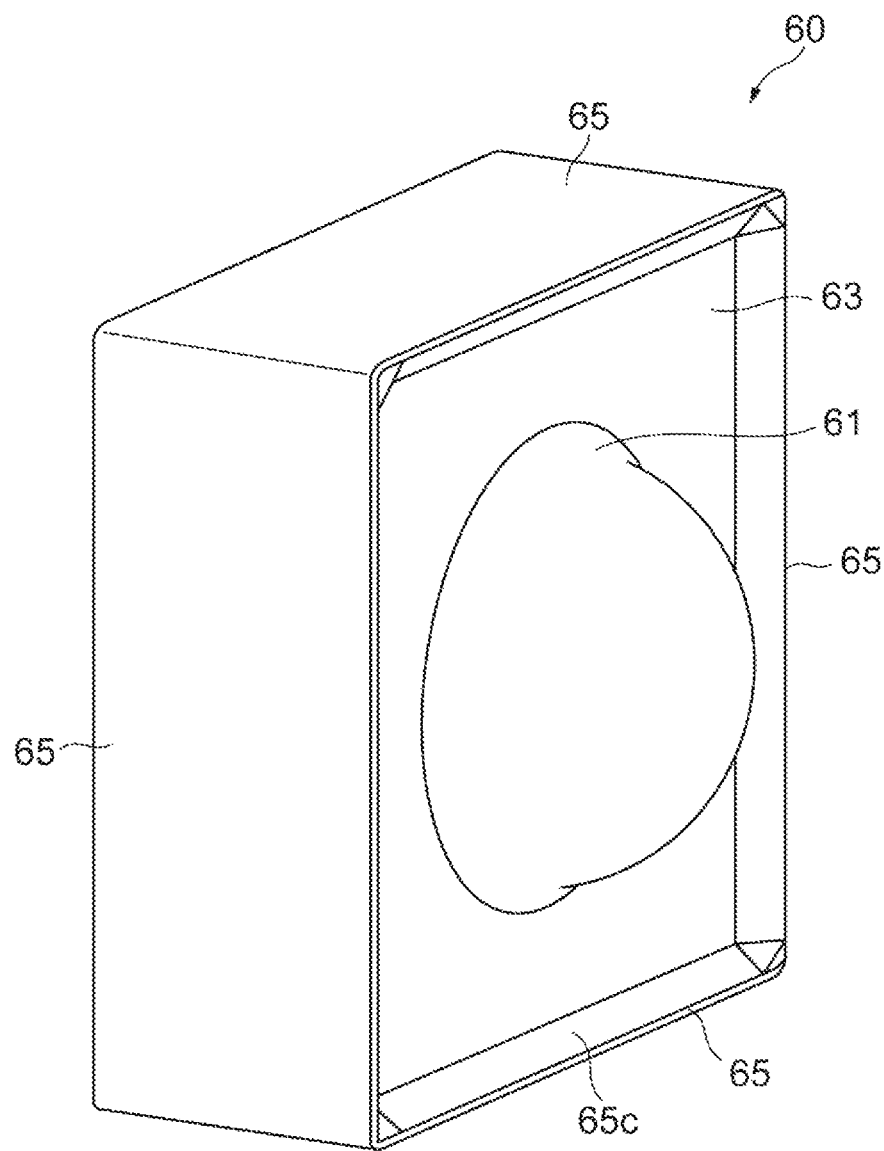
FIG. 4 is a perspective view of a lens.
Figure 5:
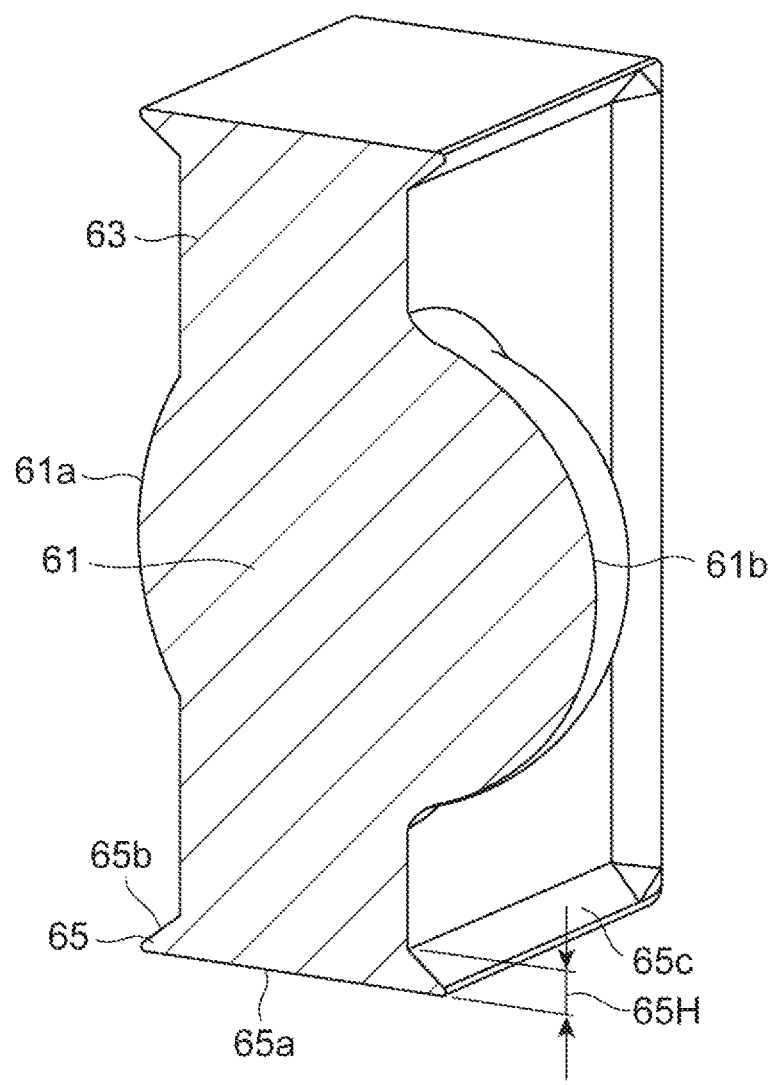
FIG. 5 is a sectional perspective view of the lens.

FIG. 4 is a perspective view of the lens. FIG. 5 is a sectional perspective view of the lens. The lens 60 is substantially of a rectangular parallelepiped configuration, and includes a lens main body 61, a flange 63, and a fixed portion 65. The lens main body 61 is an aspheric lens, and has an incidence surface 61a on which the beam emitted from the semiconductor laser chip 40 is incident, and an emission surface 61b from which the beam incident on the incidence surface 61a is emitted (See FIG. 5). The incidence surface 61a and the emission surface 61b are both curved surfaces. In the lens 60 of the example shown, the curvature of the curved surface of the incidence surface 61a is smaller than the curvature of the curved surface of the emission surface 61b. That is, the radius of curvature of the curved surface of the incidence surface 61a is larger than the radius of curvature of the curved surface of the emission surface 61b. This is due to the fact that the distance L1 between the incidence surface 61a and the emission end 43 of the semiconductor laser chip 40 is small and that the emission surface 61b collimates the light beam.

A flange 63 is of a plate-like configuration, and surrounds the peripheral edge of the lens main body 61 as seen from the axis direction. The flange 63 is rectangular as seen from the axis direction, and is of a square configuration in the example shown. The lens main body 61 is arranged at the center of the flange 63. The curved surfaces constituting the incidence surface 61a and the emission surface 61b of the lens main body 61 protrude from the flange 63 in the axis direction. The emission surface 61b protrudes further in the axis direction than the incidence surface 61a. This is due to the fact that the effective diameter of the emission surface 61b is larger than the effective diameter of the incidence surface 61a.

The fixed portion 65 is a portion fixed to the second upper surface 22 of the carrier 20 by the adhesive A. The fixed portion 65 is formed at least at a part of the peripheral edge of the flange 63. In the present embodiment, there are formed four fixed portions 65 in such a way as to surround the entire periphery of the peripheral edge of the flange 63 as seen from the axis direction. Of the four fixed portions 65, the fixed portion 65 facing the second upper surface 22 is fixed to the second upper surface 22 by the adhesive A. The distance from the fixed portion 65 to the outer edge of the incidence surface 61a is larger than the distance from the fixed portion 65 to the outer edge of the emission surface 61b. That is, in the Z-direction, the distance from the second upper surface 22 to the incidence surface 61a is larger than the distance from the second upper surface 22 to the emission surface 61b.

In the present embodiment, the flange 63 is of a square configuration as seen from the axis direction, so that there is no substantial difference between the fixed portions 65 formed on the four side surfaces of the flange 63. In the following, the fixed portion 65 facing the second upper surface 22 will be described. The fixed portion 65 has a lower surface 65a and a pair of inclined surfaces 65b and 65c. The lower surface 65a is a surface facing the second upper surface 22, and is of a rectangular configuration. In the axis direction of the lens 60, the lower surface 65a of the fixed portion 65 has a width larger than the width of the flange 63. That is, in the axis direction of the lens 60, the fixed portion 65 protrudes from the flange 63. In other words, the flange 63 is formed to be depressed with respect to the fixed portion 65. The pair of inclined surfaces 65b and 65c connect the end edge of the lower surface 65a in the axis direction with the flange 63. As shown in FIG. 3, in a sectional view, the fixed portion 65 is of a trapezoidal configuration, and the inclined surfaces 65b and 65c are inclined with respect to the lower surface 65a by a fixed angle.

In an example, the outer size of the lens 60 as seen from the axis direction may be 0.6 mm square, 1 mm square, 1.5 mm square, 0.6 mm×1.0 mm rectangle, etc. The thickness of the lens 60 in the axis direction is approximately 0.5 mm to 1 mm, and is determined in accordance with the design of the focal distance. The angle made by each of the inclined surfaces 65b and 65c and the lower surface 65a, and the height 65H of the fixed portion 65 can be arbitrarily designed. In an example, the angle made by the inclined surface 65c and the lower surface 65a may be approximately 45°, and the height 65H of the fixed portion 65 may be approximately 50 μm.

Next, each component, including the connection surface 23, will be described in more detail. In the axis direction, the connection surface 23 is provided in a direction facing the emission side of the semiconductor laser chip 40 rather than the end 33 on the emission end 43 of the semiconductor laser chip 40 on the sub carrier 30. The connection surface 23 is set back far from the end 33 of the sub carrier 30 adjacent to the emission end 43 of the semiconductor laser chip 40 toward a back end 34 of the sub carrier 30 opposite to the front end 33 in the axis direction. That is, the connection surface 23 retreats further away from the lens 60 than the end 33 facing the lens 60 on the sub carrier 30. In the axis direction (the X-axis direction), the distance from the connection surface 23 of the carrier 20 to the incidence surface 61a of the lens 60 is larger than the distance from the end 33 of the sub carrier 30 to the incidence surface 61a of the lens 60. As one example, the distance from the connection surface 23 to the lens 60 may be between 0.05 mm and 0.30 mm.

In the present embodiment, the size of the diameter of the collimated beam emitted from the transmitter module 1 can be designed to be small, for example, approximately 0.5 mm. In this case, the transmitter module 1 can be designed based on numerical aperture (NA) of the semiconductor laser chip 40, the collimating lens design (aspheric configuration and thickness), and the distance in the axis direction from the emission position of the semiconductor laser chip 40 to the incidence surface 61a of the lens 60 (hereinafter sometimes referred to as the distance L1).

In an example, it is to be assumed that the NA of the semiconductor laser chip 40 is 0.45, that the refractive index (Nd) of the lens 60 is 1.51, that the outer diameter of the lens 60 (the length in the Z-axis direction and in the Y-axis direction) is 1 mm square, that the thickness L5 of the lens main body 61 is 0.55 mm, and that the distance L1 is 0.15 mm. In the case where the thickness L4 of the adhesive A for bonding the lens 60 is, for example, 0.05 mm, the distance from the second upper surface 22 of the carrier 20 to the axis S is 0.55 mm. The thickness in the Z-axis direction of the sub carrier 30 on which the semiconductor chip 40 is mounted is 0.2 mm from the viewpoint of high frequency design. The first upper surface 21 of the carrier 20 is formed at a position 0.25 mm higher in the Z-axis direction than the second upper surface 22. The thickness in the Z-axis direction of the semiconductor laser chip 40 is 0.1 mm. As a result, the height from the second upper surface 22 of the carrier 20 to the emission position of the semiconductor laser chip 40 is 0.55 mm.

In an example, the semiconductor laser chip 40 is mounted at a position shifted rearwards in the axis direction by 0.05 mm from the end 33 of the sub carrier 30. Thus, the distance L2 from the end 33 of the sub carrier 30 to the incidence surface 61a of the lens 60 is given as the distance L1−0.05 mm, which is 0.10 mm. Further, assuming that the sum total of the mounting precision of each component and the clearance for aligning the lens 60 is ±0.05 mm, the minimum value $L2_{min}$ of the distance L2 is given as the distance L2−0.05 mm, which is 0.05 mm. The position of the connection surface 23 of the carrier 20 is retracted by the distance L3 from the end 33 of the sub carrier 30 in such a way as to be away from the lens 60. Taking into consideration of the tolerance of each component, mounting precision, the alignment clearance of the lens 60, etc., the distance L3 may, for example, be 0.2 mm. That is, when the distance L2 is an average value, the distance from the connection surface 23 to the lens 60 is 0.3 mm.

Next, a method for fixing the lens 60 will be described. First, the adhesive A is applied to a predetermined position on the second upper surface 22 of the carrier 20. The predetermined position is the position to which the lens 60 is to be fixed. Next, the lens 60 is arranged at the predetermined position. As a result, the adhesive A is filled into the space between the lower surface 65a of the lens 60 and the second upper surface 22. Further, there is formed a fillet expanding in four directions from the lower surface 65a of the lens 60 upwards to a height of approximately 0.15 mm That is, the inclined surfaces 65b and 65c of the fixed portion 65 are covered with the adhesive A. Next, the alignment of the lens 60 is performed. For example, in order that the emission beam from the lens 60 may become a desired collimated beam, fine adjustment is performed on the position of the lens 60 within a range of approximately ±20 μm in the X-axis direction, the Y-axis direction, and the Z-axis direction. Next, in the state in which the emission beam has become a collimated beam through the alignment, the position of the lens 60 is fixed, and ultraviolet rays are applied to the adhesive A. As a result, the lens 60 is temporarily fixed in position. Next, the adhesive A is thermally cured in a baking furnace at approximately 120° C., and the lens 60 is finally fixed in position. Through the above process, the lens 60 is fixed to the carrier 20.

Figure 6:
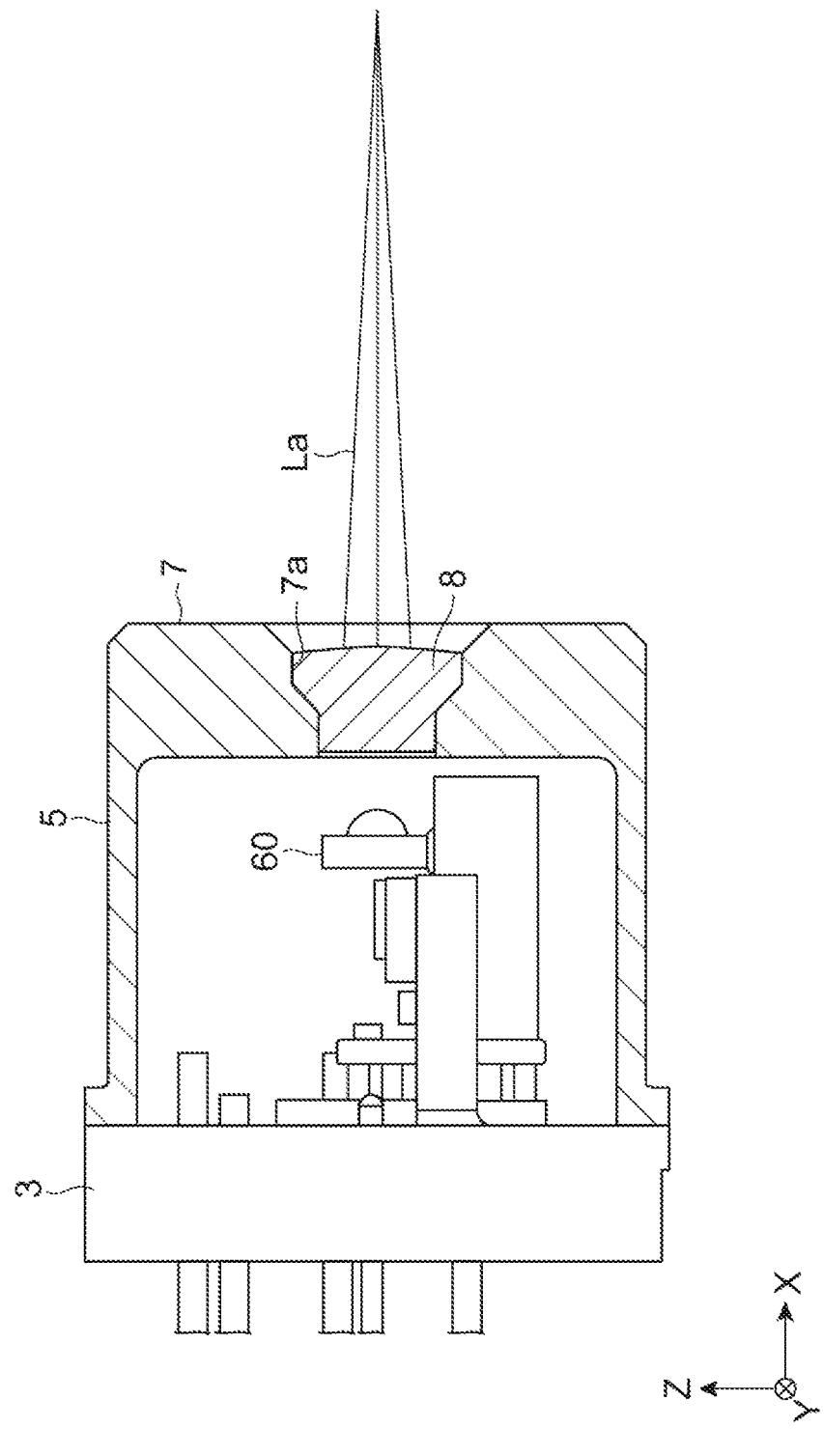
FIG. 6 is a sectional view of the transmitter module.

FIG. 6 is a sectional view of the transmitter module. As shown in FIG. 6, in the case where a collimated beam is emitted from the lens 60, a condensing lens 8 is arranged at the opening 7a of the cap 5, whereby it is possible to output a convergent beam from the CAN package 4. Further, in the case, where a collimated beam is emitted from the lens 60, a flat window is arranged at the opening 7a of the cap 5, whereby it is possible to output a collimated beam from the CAN package 4.

Figure 7:
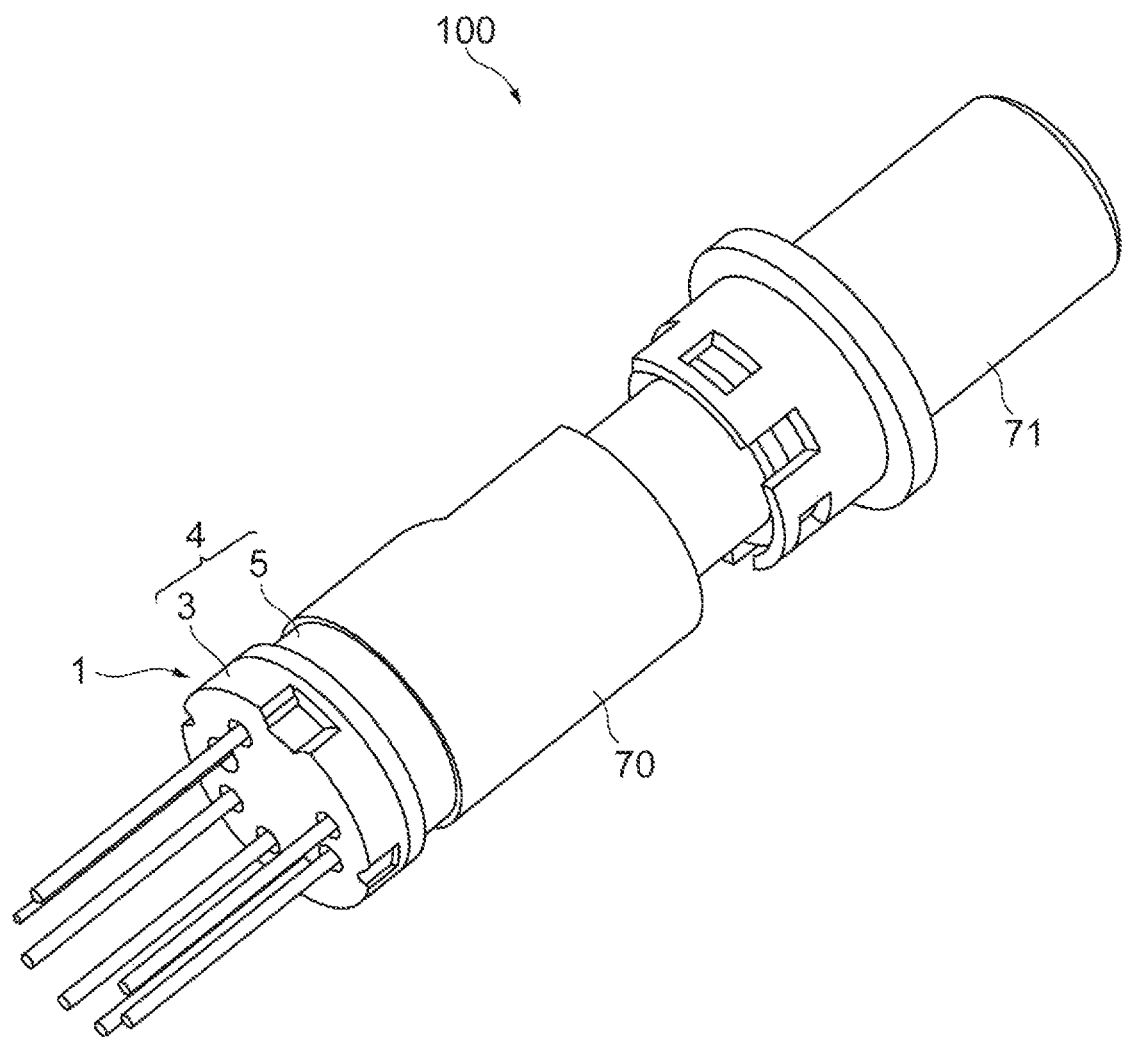
FIG. 7 is a perspective view of a TOSA employing the transmitter module.

FIG. 7 is a perspective view of a TOSA employing the transmitter module. The transmitter module 1 of the present embodiment is connected to a sleeve 71 containing stub via a joint 70, whereby the transmitter module can be used as a transmitter module (TOSA) 100. Further, through combination with a receiver device, it can be used as a bidirectional module (BOSA). Further, a plurality of transmitter modules 1 each having a different wavelength are arranged side by side, and they are optically connected each other by an optical component such as a filter or a mirror, whereby the whole can be used as an integrated module. For example, four transmitter modules of 10 Gbps may be arranged side by side and may be used as an integrated module of 40 Gbps. Two transmitter modules of 25 Gbps may be arranged side by side and may be used as an integrated module of 50 Gbps. Three transmitter modules of 25 Gbps may be arranged side by side and may be used as an integrated module of 75 Gbps. Four transmitter modules of 25 Gbps may be arranged side by side and may be used as an integrated module of 100 Gbps.

Figure 8:
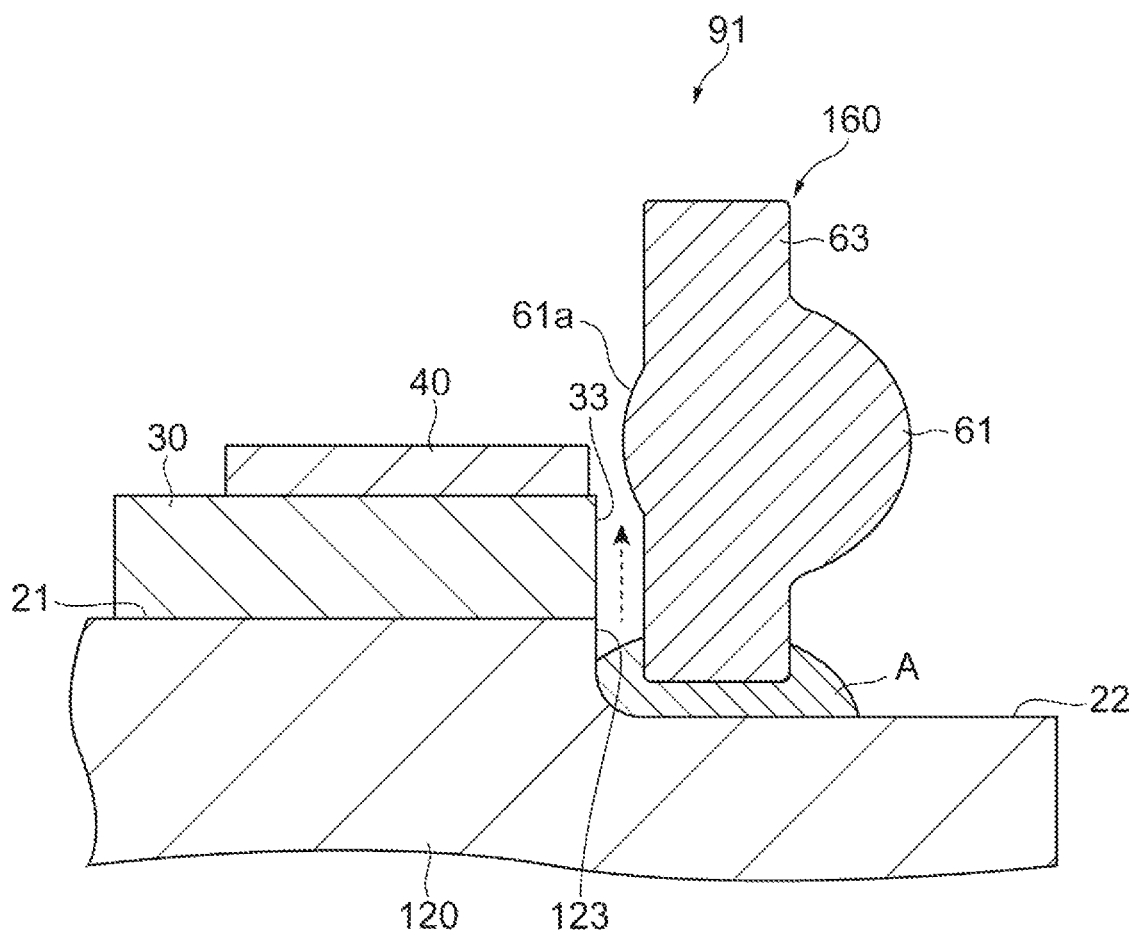
FIG. 8 is an enlarged partial sectional view of a transmitter module according to a comparative example.
Figure 9:
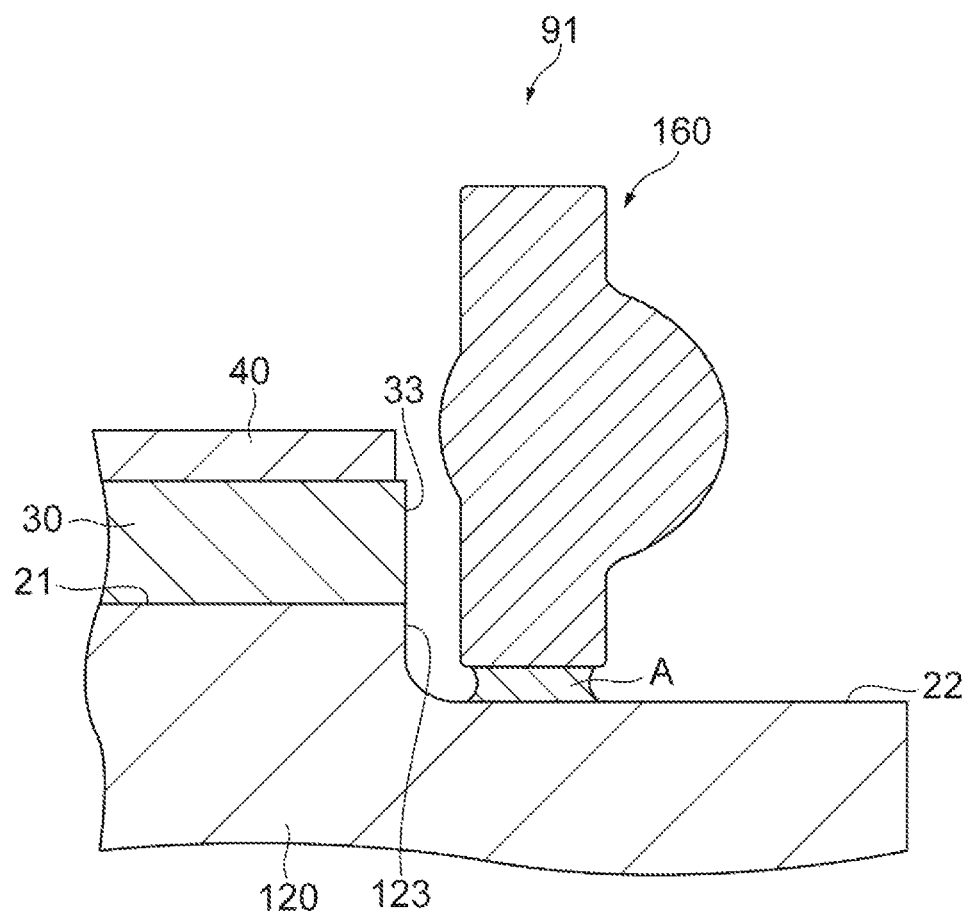
FIG. 9 is an enlarged partial sectional view of a transmitter module according to a comparative example.

FIGS. 8 and 9 are partial sectional views of a transmitter module according to a comparative example. A transmitter module 91 according to a comparative example differs from the transmitter module 1 of the above-described embodiment in that the position of the connection surface 123 of the carrier 120 in the axis direction coincides with the end 33 of the sub carrier 30. The distance from the emission position of the semiconductor laser chip 40 to the lens 160 depends upon the focal distance of the lens 160. Thus, the distance from the end 33 of the sub carrier 30 facing the lens 160 to the lens 160 also depends upon the focal distance of the lens 160. In the case where the distance from the sub carrier 30 to the lens 160 is small to achieve a reduction in the size of the entire apparatus, when the end 33 and the connection surface 123 are flush with each other, the distance from the connection surface 123 to the lens 160 is also diminished, so that there is a fear of some adhesive resin being allowed to adhere to the connection surface 123 of the carrier 120 during the alignment of the lens 160. Further, as indicated by the arrow in FIG. 8, it may occur that the adhesive A rises in the gap between the carrier 120, the sub carrier 30, and the lens 160 due to the capillary phenomenon, adhering to the incidence surface 161a of the lens 160, the end 33 of the sub carrier 30, the end of the semiconductor laser chip 40, etc. When the adhesive A is allowed to solidify in the state in which it adheres to the connection surface 123 of the carrier 120 or the end 33 of the sub carrier 30, it may occur that at the time of final fixation using the baking furnace, the position of the lens 60 undergoes fine fluctuation due to the thermal contraction of the adhesive A. In this case, the axis can be inclined as a result of the lens 160 being deviated to the right, left, upper, or lower side. Further, in the case where the lens 60 is deviated in the front-rear direction, the quality of the collimated beam deteriorates. That is, it can happen that the collimated configuration is allowed to slightly diverge or converge. Further, at the time of the reliability test (temperature cycle test) of the transmitter module, thermal contraction of the adhesive A is repeated, whereby the position of the lens 60 undergoes fine fluctuation, which may result in deterioration in the quality of the collimated beam.

In the transmitter module 1 of the present embodiment, the connection surface 23 of the carrier 20 is further retracted so as to be farther away from the lens 60 than the end 33 of the sub carrier 30, such that it is possible to secure an arbitrarily long distance from the connection surface 23 of the carrier 20 to the lens 60. In this way, the connection surface 23 of the carrier 20 is further retracted from the end 33 of the sub carrier 30, whereby it is possible to prevent the adhesive A from reaching the connection surface 23. Thus, it is possible to prevent positional deviation of the lens 60 due to contraction of the adhesive A.

Further, in the transmitter module 91 of the comparative example, it might be possible to prevent adhesion of the adhesive A to the connection surface 123 of the carrier 120 by reducing the amount of the adhesive A. In that case, however, no appropriate fillet could be formed. That is, the adhesive A assumes an improper constricted configuration as shown in FIG. 9, and the adhesion strength can deteriorate. Further, in the lens 160 of the comparative example, there is not formed fixed portion protruding in the axis direction beyond the flange 63, and the length of the lower surface of the lens 160 in the axis direction is as small as, for example, 0.3 mm. Thus, in some cases, the adhesion strength is low even in an appropriate fillet state.

In the axis direction of the lens 60, the lens 60 of the present embodiment has a fixed portion 65 having a width larger than the width of the flange 63. In this configuration, it is possible to enlarge the area of the portion of the fixed portion 65 facing the second upper surface 22, so that it is possible to fix the fixed portion 65 firmly to the second upper surface 22. Further, the fillet can be formed such that the adhesive A covers the fixed portion 65, so that it is possible to fix the lens 60 more firmly in position.

Further, in the Y-axis direction, the distance from the second upper surface 22 to the incidence surface 61a is larger than the distance from the second upper surface 22 to the emission surface 61b. In this configuration, even if the adhesive applied to the second upper surface 22 is allowed to reach the connection surface 23, it is possible to prevent the adhesive from reaching the incidence surface 61a.

The specific features of the embodiment described in detail above with reference to the drawings, such as the size, material, and configuration, are not restricted to those of this embodiment.

Figure 10:
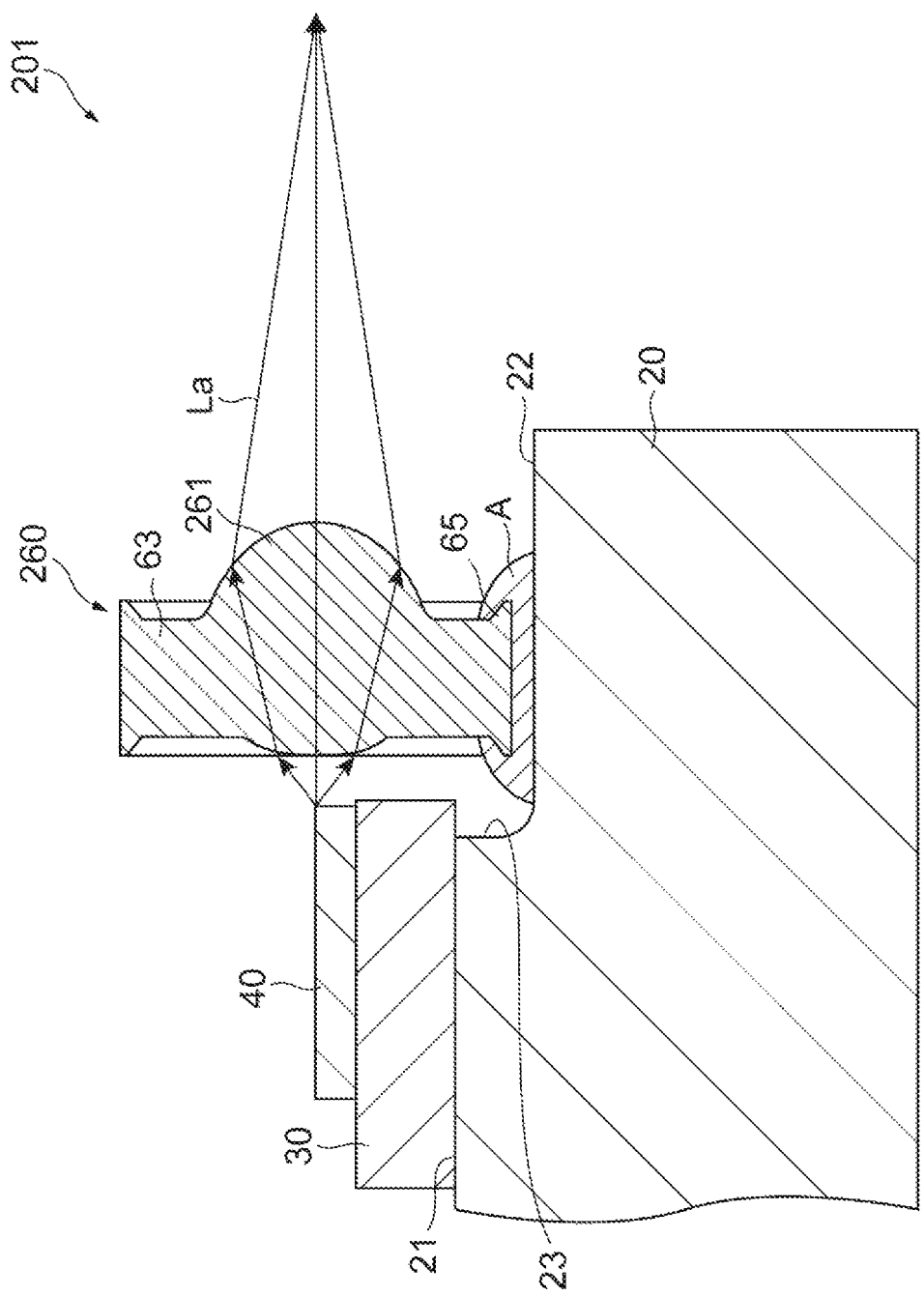
FIG. 10 is an enlarged partial sectional view of a transmitter module according to another embodiment.

For example, as shown in FIG. 10, in a transmitter module 201 according to another embodiment, it is possible to employ another lens 260 instead of the lens 60 for emitting a collimated beam. In the example of FIG. 10, the lens 260 has a lens main body 261, the flange 63, and the fixed portion 65. The lens main body 261 is a condensing lens converging the emission beam La from the semiconductor laser chip 40. In this case, by arranging a flat window at the opening 7a of the cap 5, it is possible to output a converged beam from the CAN package 4.

Figure 11:
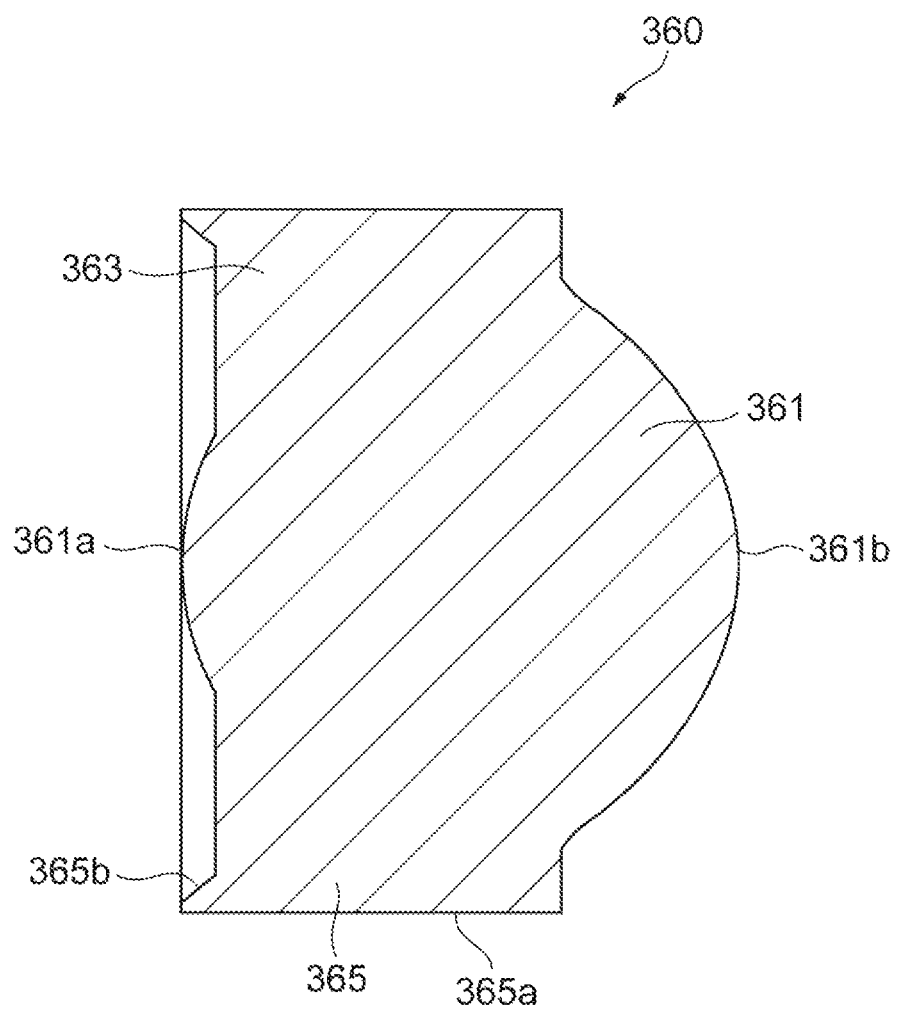
FIG. 11 is a sectional view of a lens according to yet another embodiment.

In yet another transmitter module, a lens 360 shown in FIG. 11 may be employed instead of the lens 60. The lens 360 shown in FIG. 11 is substantially of a rectangular parallelepiped configuration, and includes a lens main body 361, a flange 363, and a fixed portion 365. The lens main body 361 is an aspheric lens, and has an incidence surface 361a on which the beam emitted from the semiconductor laser chip 40 is incident, and an emission surface 361b from which the beam incident on the incidence surface 361a is emitted. Both the incidence surface 361a and the emission surface 361b are curved surfaces. The curvature at the curved surface of the incidence surface 361a is smaller than the curvature at the curved surface of the emission surface 361b. In this configuration, in the case where a collimated beam is emitted from the emission surface of the lens, the diameter of the collimated beam can be enlarged.

The flange 363 is of a plate-like configuration, and surrounds the peripheral edge of the lens main body 361 as seen from the axis direction. The flange 363 is rectangular as seen from the axis direction. In the example shown, it is square. The lens main body 361 is arranged at the center of the flange 363. In the axis direction, the thickness of the flange 363 is larger than the thickness of the flange 63 of the above-described embodiment. Thus, on the emission surface 361b, the flange 363 is connected as it is to the lower surface 365a. The fixed portion 365 has the lower surface 365a and an inclined surface 365b protruding to the incidence surface 361a. That is, the fixed portion 365 protrudes from the flange 363 solely on one side in the axis direction. The configuration of the inclined surface 365b is the same as that of the inclined surface 65b.

Figure 12:
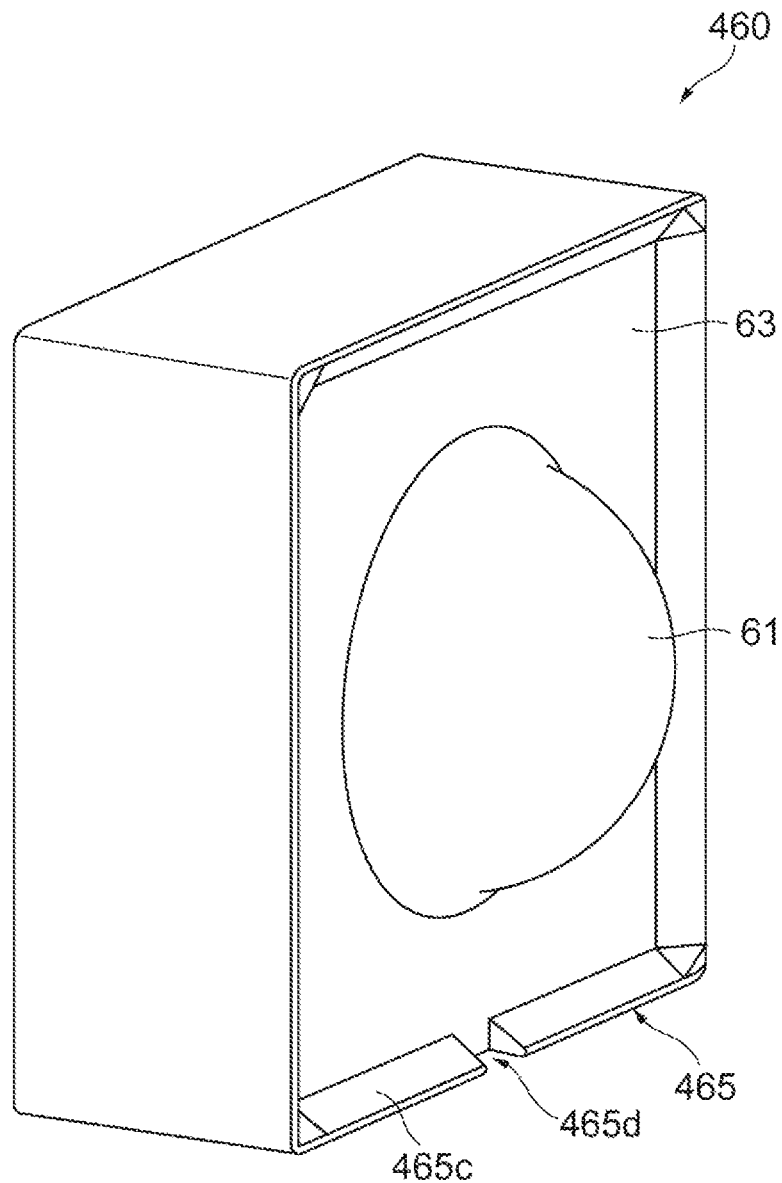
FIG. 12 is a perspective view of a lens according to yet another embodiment.

As shown in FIG. 12, a slit 465d extending in the axis direction of a lens 460 may be formed in a fixed portion 465. In the example shown in FIG. 12, the lens 460 has the lens main body 61, the flange 63, and the fixed portion 465. The configuration of the fixed portion 465 is the same as that of the fixed portion 65 except that the slit 465d is formed. That is, the fixed portion 465 has an inclined surface 465c. The slit 465d of the fixed portion 465 is formed to extend from the end portion in the axis direction of the fixed portion 365 to the position of the flange 63. In an example, the slit 465d is formed at the center in the right-left direction. Although not shown in FIG. 12, the fixed portion 465 also protrudes on the incidence surface, and the slit 465d is formed also on the incidence surface. Due to the formation of the slit 465d, the portion protruding from the position of the flange 63 and including the inclined surface 465c is divided in the direction (right-left direction) crossing the axis. In this configuration, even if adhesive enters the slit 465d, and an external force is exerted in a planar direction crossing the axis direction, it is possible to achieve an improvement in teams of the durability of the lens 460 with respect to the external force.

While in the above-described example the lens is formed of resin, the lens may be formed, for example, of glass. In the case where the lens is formed of resin, the production cost of the lens is likely to be reduced.

What is claimed is:

1. A transmitter module comprising:
    a semiconductor laser chip;
    a first carrier mounting the semiconductor laser chip thereon;
    a second carrier including a first surface, a second surface, and a connection surface connecting the first surface with the second surface, wherein the first surface faces in a first direction intersecting an axis direction of the semiconductor laser chip so as to mount the first carrier thereon, and the second surface faces in the first direction and is provided at a position farther away from the axis of the semiconductor laser chip than the first surface; and
    a lens fixed to the second surface by an adhesive resin such that an emission beam from the semiconductor laser chip is incident on the lens,
    wherein the connection surface is set back far from a front end of the first carrier adjacent to an emission end of the semiconductor laser chip toward a back end of the first carrier opposite to the front end in the axis direction.

2. The transmitter module according to claim 1, wherein the lens includes a lens main body, a flange surrounding a peripheral edge of the lens main body, and a fixed portion provided at least at a portion of a peripheral edge of the flange and fixed to the second surface of the second carrier; and
    wherein the fixed portion protrudes from the flange in the axis direction.

3. The transmitter module according to claim 2, wherein the fixed portion has a slit extending in the axis direction.

4. The transmitter module according to claim 2, wherein the fixed portion protrudes from the flange solely on one side of the axis direction.

5. The transmitter module according to claim 1, wherein the lens is a resin lens.

6. The transmitter module according to claim 1,
wherein the lens includes a first region on which an emission beam from the semiconductor laser chip is incident and which has a curvature, and a second region from which the incident emission beam is emitted and which has a curvature; and
a distance from the second surface to the first region is larger than a distance from the second surface to the second region along the first direction.

\* \* \* \* \*